(12) United States Patent
Daubenspeck et al.

(10) Patent No.: US 7,348,210 B2
(45) Date of Patent: Mar. 25, 2008

(54) POST BUMP PASSIVATION FOR SOFT ERROR PROTECTION

(75) Inventors: Timothy H. Daubenspeck, Colchester, VT (US); Jeffrey Peter Gambino, Westford, VT (US); Christopher David Muzzy, Burlington, VT (US); Wolfgang Sauter, Richmond, VT (US); Edmund Juris Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,084

(22) Filed: Apr. 27, 2005

(65) Prior Publication Data

US 2006/0246703 A1 Nov. 2, 2006

(51) Int. Cl.
*H01L 21/00* (2006.01)
(52) U.S. Cl. .................. 438/106; 438/14; 438/15; 438/26; 438/51; 257/E21.499; 257/E23.001; 257/E23.003
(58) Field of Classification Search ................ 438/612, 438/613, 614, 14, 15, 26, 51, 55, 64, 106, 438/125; 257/678, 687, E21.499, E23.001, 257/E23.003
See application file for complete search history.

(56) References Cited

U.S. PATENT DOCUMENTS

| | | | |
|---|---|---|---|
| 4,468,411 A | 8/1984 | Sloan et al. | |
| 4,736,012 A | 4/1988 | Shoji et al. | |
| 4,758,875 A | 7/1988 | Fujisaki et al. | |
| 4,975,762 A | 12/1990 | Stradley et al. | |
| 6,143,638 A | 11/2000 | Bohr | |
| 6,187,680 B1 * | 2/2001 | Costrini et al. | 438/688 |
| 6,410,414 B1 | 6/2002 | Lee | |
| 6,566,737 B2 | 5/2003 | Bohr | |
| 2003/0011068 A1 | 1/2003 | Song et al. | |
| 2004/0027788 A1 * | 2/2004 | Chiu et al. | 361/329 |
| 2004/0041258 A1 | 3/2004 | Song et al. | |
| 2006/0038291 A1 * | 2/2006 | Chung et al. | 257/738 |

FOREIGN PATENT DOCUMENTS

| | | | |
|---|---|---|---|
| EP | 0547989 A | * | 6/1993 |
| EP | 0547989 A2 | | 6/1993 |
| US | EP0547959 | * | 6/1993 |

OTHER PUBLICATIONS

Definition of "Alpha particle" by www.answers.com; search word: alpha particle.*

* cited by examiner

*Primary Examiner*—Matthew Smith
*Assistant Examiner*—Su C. Kim
(74) *Attorney, Agent, or Firm*—Schmeiser, Olsen & Watts; William D. Sabo

(57) ABSTRACT

A structure and a method for forming the same. The method includes (a) providing a structure which includes (i) a dielectric layer, (ii) an electrically conducting bond pad on and in direct physical contact with the dielectric layer top surface, (iii) a first passivation layer on the dielectric layer top surface and on the electrically conducting bond pad, wherein the first passivation layer comprises a first hole directly above the electrically conducting bond pad, and (iv) an electrically conducting solder bump filling the first hole and electrically coupled to the electrically conducting bond pad; and (b) forming a second passivation layer on the first passivation layer, wherein second passivation layer is in direct physical contact with the electrically conducting solder bump, and wherein the electrically conducting solder bump is exposed to a surrounding ambient immediately after said forming the second passivation layer is performed.

5 Claims, 8 Drawing Sheets

POST BUMP PASSIVATION FOR SOFT ERROR PROTECTION

BACKGROUND OF THE INVENTION

1. Technical Field

The present invention relates to flip-chip technologies, and more specifically, to soft error issue in flip-chip technologies.

2. Related Art

In flip-chip technologies, solder bumps are typically formed on top of a semiconductor chip (i.e., integrated circuit IC). Each solder bump is formed directly on a bond pad of the chip. The chip is then flipped face down and then aligned to a package/substrate so that the solder bumps are bonded directly, simultaneously, and one-to-one to the pads of the package/substrate (called package/substrate pads). After that, an adhesive underfill material is used to fill the empty space between the chip and the package/substrate. Once in place, the adhesive underfill material is cured at a high temperature so as to form a solid underfill layer that tightly bonds the chip to the package/substrate. In some applications, multiple chips can be attached (i.e., bonded) to a single substrate using flip-chip technologies so as to form a multi-chip module (MCM). However, if one of the chips in the MCM is later found defective through testing, the entire MCM is wasted because with current materials it is not possible to replace the defective chip of the MCM (because all the chips of the MCM are tightly bonded to the substrate by the solid underfill layer). One way to solve this problem is to forgo the solid underfill layer by omitting the underfill process. However, for ceramic substrates, without the solid underfill layer separating the substrate from the chips, alpha particles (large subatomic fragments consisting of 2 protons and 2 neutrons) that continuously emit from the substrate would easily enter the chips of the MCM resulting in a substantially larger number of soft errors in the MCM during the normal operation of the MCM.

Therefore, there is a need for a structure (and a method for forming the same) that allows omission of underfill for chip replacement without substantially increasing the soft error rate in the structure during the normal operation of the structure.

SUMMARY OF THE INVENTION

The present invention provides a structure formation method, comprising providing a structure which includes (a) a dielectric layer including a dielectric layer top surface that defines a reference direction essentially perpendicular to the dielectric layer top surface, (b) an electrically conducting bond pad on and in direct physical contact with the dielectric layer top surface, (c) a first passivation layer on the dielectric layer top surface and on the electrically conducting bond pad, wherein the first passivation layer comprises a first hole directly above the electrically conducting bond pad, and (d) an electrically conducting solder bump filling the first hole and electrically coupled to the electrically conducting bond pad; and forming a second passivation layer on the first passivation layer, wherein second passivation layer is in direct physical contact with the electrically conducting solder bump, and wherein the electrically conducting solder bump is exposed to a surrounding ambient immediately after said forming the second passivation layer is performed.

The present invention also provides a structure formation method, comprising providing a structure which includes (a) a dielectric layer including a dielectric layer top surface that defines a reference direction essentially perpendicular to the dielectric layer top surface, (b) N electrically conducting bond pads on and in direct physical contact with the dielectric layer top surface, N being an integer greater than one, (c) a first passivation layer on the dielectric layer top surface and on the N electrically conducting bond pads, wherein the first passivation layer comprises N holes which are one-to-one directly above the N electrically conducting bond pads, (d) N electrically conducting solder bumps filling one-to-one the N holes and electrically coupled one-to-one to the N electrically conducting bond pads; and forming a second passivation layer on the first passivation layer, wherein second passivation layer is in direct physical contact with the electrically conducting solder bump, and wherein the electrically conducting solder bump is exposed to a surrounding ambient immediately after said forming the second passivation layer is performed.

The present invention also provides a structure, comprising (a) a dielectric layer including a dielectric layer top surface that defines a reference direction essentially perpendicular to the dielectric layer top surface; (b) N electrically conducting bond pads on and in direct physical contact with the dielectric layer top surface, N being a positive integer; (c) a first passivation layer on the dielectric layer top surface and on the N electrically conducting bond pads, wherein the first passivation layer comprises N holes which are one-to-one directly above the N electrically conducting bond pads, and wherein the first passivation layer comprises a first dielectric material; (d) N electrically conducting solder bumps filling one-to-one the N holes and electrically coupled one-to-one to the N electrically conducting bond pads, wherein the N electrically conducting solder bumps comprise a first electrically conducting material; (e) N electrically conducting ball limiting metallization (BLM) regions, wherein, for k=1, 2, . . . , N, the $k^{th}$ electrically conducting BLM region of the N electrically conducting BLM regions (i) is sandwiched between and in direct physical contact with the $k^{th}$ electrically conducting solder bump of the N electrically conducting solder bumps and the $k^{th}$ electrically conducting bond pad of the N electrically conducting bond pads, and (ii) is sandwiched between and in direct physical contact with the $k^{th}$ electrically conducting solder bump of the N electrically conducting solder bumps and the first passivation layer, and wherein the N electrically conducting BLM regions comprise a second electrically conducting material different from the first electrically conducting material; and (f) a second passivation layer on the first passivation layer; and wherein second passivation layer comprises a second dielectric material, and wherein second passivation layer is in direct physical contact with the N electrically conducting solder bumps.

The present invention provides a structure (and a method for forming the same) that allows omission of underfill for chip replacement without substantially increasing the soft error rate in the structure during the normal operation of the structure.

DETAILED DESCRIPTION OF THE INVENTION

FIGS. 1-8 illustrate the fabrication of a solder bump structure 100, in accordance with embodiments of the present invention. More specifically, with reference to FIG. 1, in one embodiment, the fabrication of the structure 100 starts with a dielectric layer 110 at top of a semiconductor chip (not shown for simplicity) with an electrically conducting line 120 (comprising copper (Cu) in one embodiment) embedded in the dielectric layer 110. It should be noted that the Cu line 120 is a part of a top interconnect layer (not shown) of the semiconductor chip. There may be additional interconnect layers (not shown) beneath the top interconnect layer, but these additional interconnect layers are also not shown for simplicity.

Figure 1:
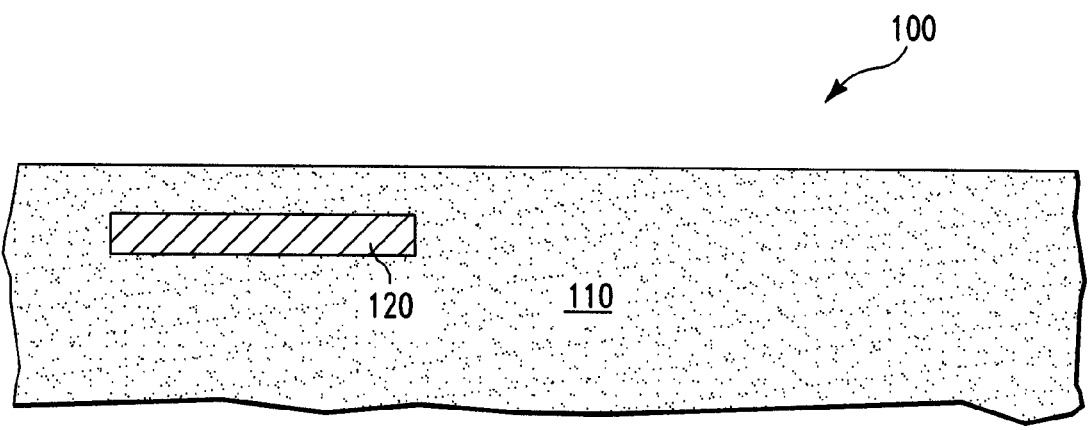
FIGS. 1-8 illustrate the fabrication of a solder bump structure, in accordance with embodiments of the present invention.
Figure 2:
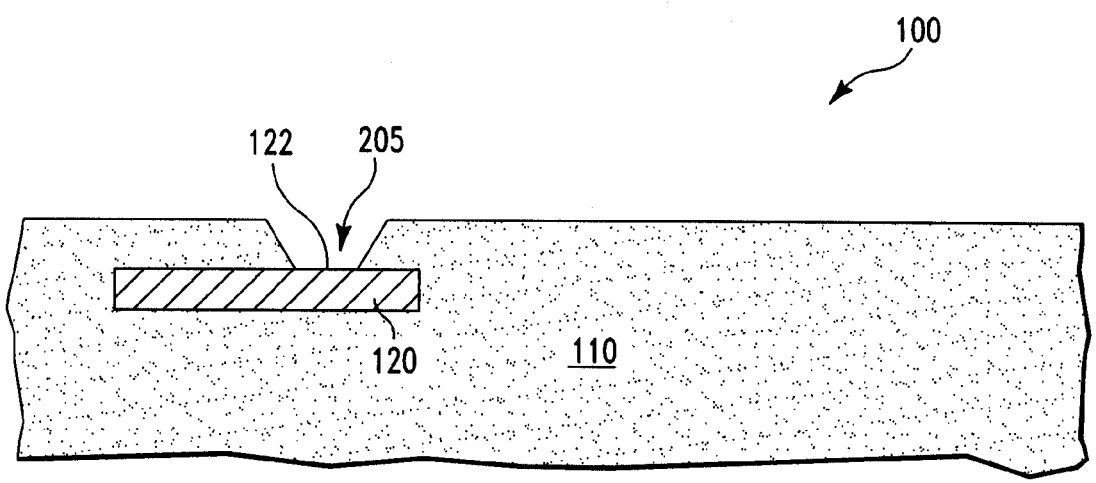

Next, with reference to FIG. 2, in one embodiment, a portion of the dielectric layer 110 is removed so as to create an opening 205 such that a top surface 122 of the Cu line 120 is exposed to the surrounding ambient via the opening 205.

Figure 3:
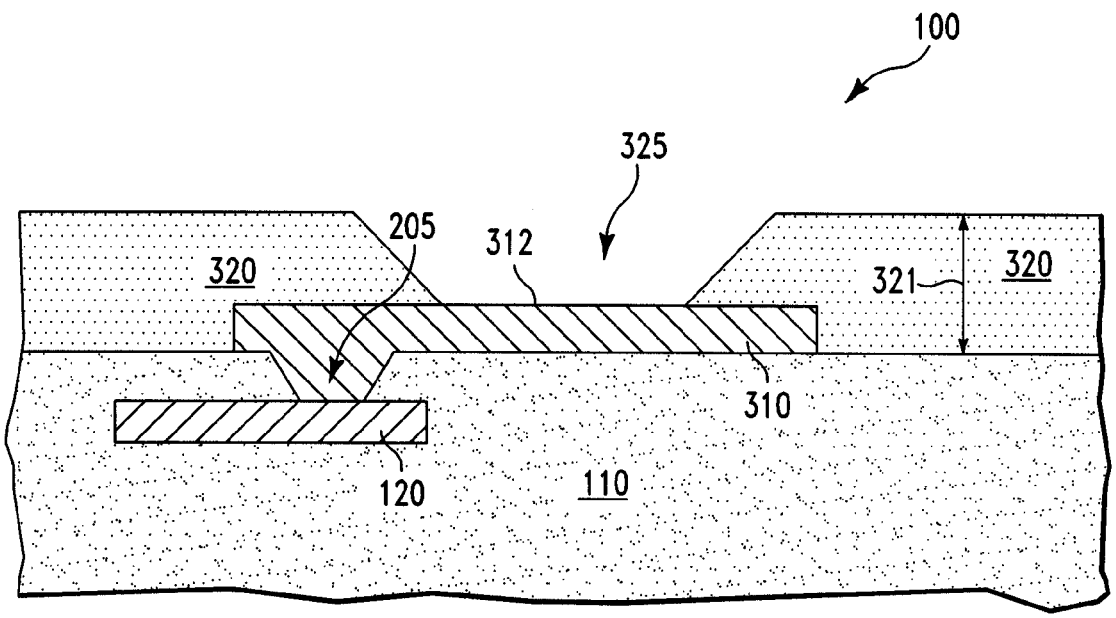

Next, with reference to FIG. 3, in one embodiment, a bond pad 310 (comprising aluminum (Al) in one embodiment) is formed on top of the Cu line 120 and the dielectric layer 110 such that the Al bond pad 310 is electrically coupled to the Cu line 120. Illustratively, the Al bond pad 310 can be formed by (a) forming an Al layer (not shown) on the entire structure 100 of FIG. 2, then (b) directionally and selectively etching back the Al layer stopping at the dielectric layer 110. The directional and selective etching in step (b) may be performed using a traditional lithographic process such that what remains of the Al layer after the directional etching is the Al bond pad 310.

Next, in one embodiment, a patterned passivation layer 320 (comprising polyimide and having a thickness 321 of about 4 μm in one embodiment) is formed on top of the Al bond pad 310 and the dielectric layer 110 by, illustratively, a photo lithographic process. The patterned passivation layer 320 is formed with an opening 325 directly above the Al bond pad 310 such that a top surface 312 of the Al bond pad 310 is exposed to the surrounding ambient.

Figure 4:
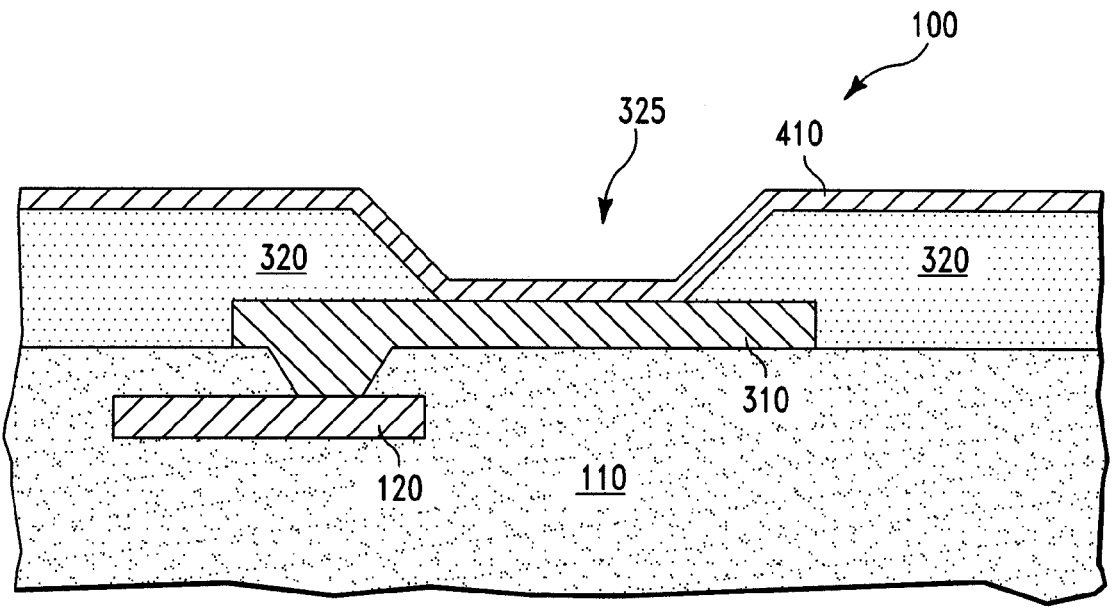

Next, with reference to FIG. 4, in one embodiment, a ball limiting metallization (BLM) film 410 is formed on top of the entire structure 100 of FIG. 3 by, illustratively, sputter deposition. Illustratively, the BLM film 410 comprises multiple layers of copper (Cu), chrome (Cr), and gold (Au).

Figure 5:
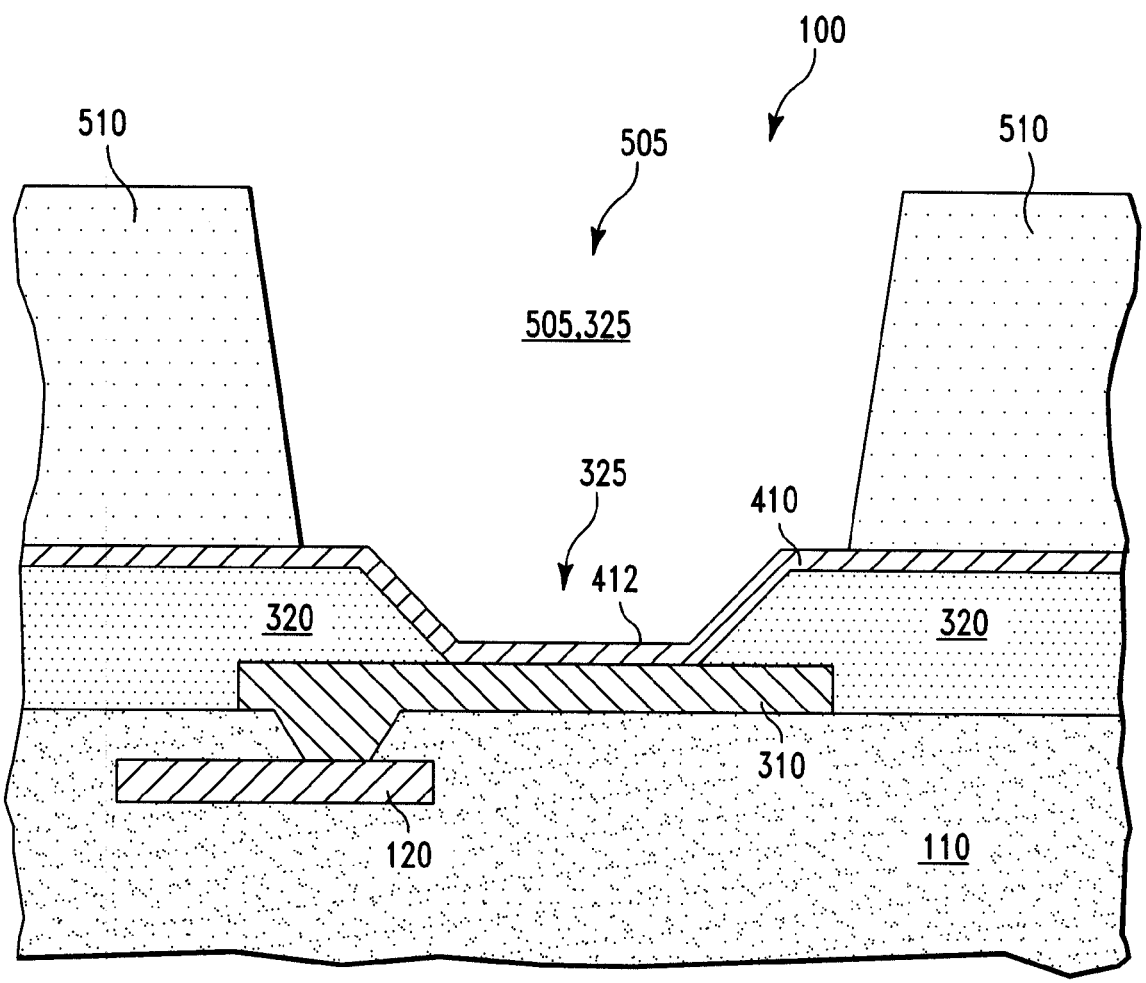

Next, with reference to FIG. 5, in one embodiment, a patterned photoresist layer 510 is formed on top of the structure 100 of FIG. 4 with an opening 505 directly above the Al bond pad 310. As a result, the opening 505 and the opening 325 are aligned and therefore can be collectively referred to as the opening 505,325.

Figure 6:
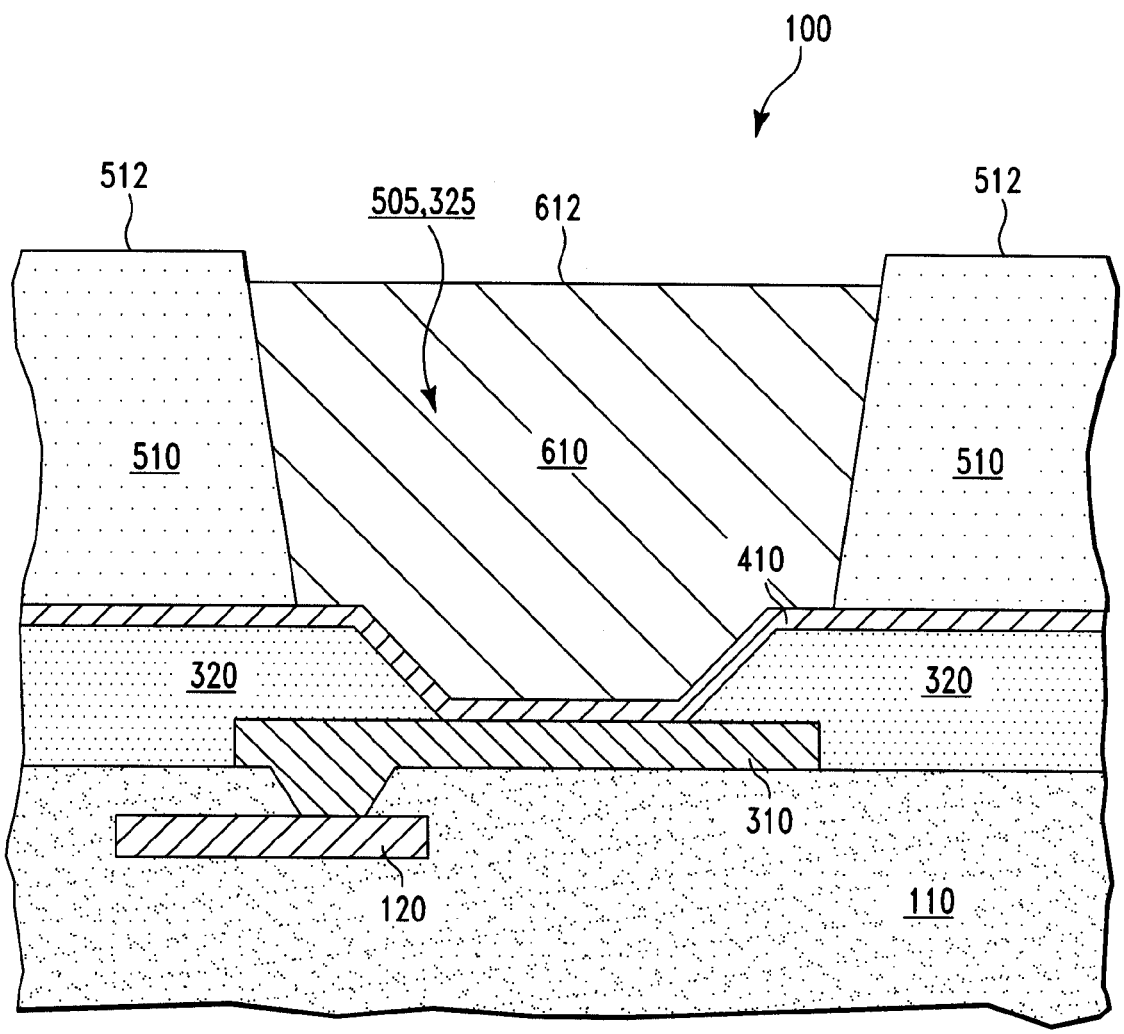

Next, with reference to FIG. 6, in one embodiment, a solder bump 610 (comprising lead (Pb) and tin (Sn) in one embodiment) is formed in the opening 505,325 by, illustratively, electroplating. More specifically, in one embodiment, the structure 100 of FIG. 5 is submerged in a solution (not shown) containing tin and lead ions. The BLM film 410 is electrically coupled to the cathode of an external dc (direct current) power supply (not shown), while the solution is electrically coupled to the anode of the dc supply. Under the electric field created in the solution by the dc power supply, tin and lead ions in the solution arrive at the exposed surface 412 (FIG. 5) of the BLM film 410 and deposit there forming the solder bump 610.

In one embodiment, the solder bump 610 is formed such that its top surface 612 is at a lower level than a top surface 512 of the patterned photoresist layer 510. Alternatively, the solder bump 610 is formed such that its top surface 612 is at a higher level than a top surface 512 of the patterned photoresist layer 510.

Next, in one embodiment, the patterned photoresist layer 510 is removed, and then the BLM film 410 is etched by, illustratively, a plasma etch process such that a BLM region 410' (FIG. 7) (i) sandwiched between the solder bump 610 and the patterned passivation layer 320 and (ii) sandwiched between the solder bump 610 and the Al bond pad 310 is carved out from the BLM film 410.

Figure 7:
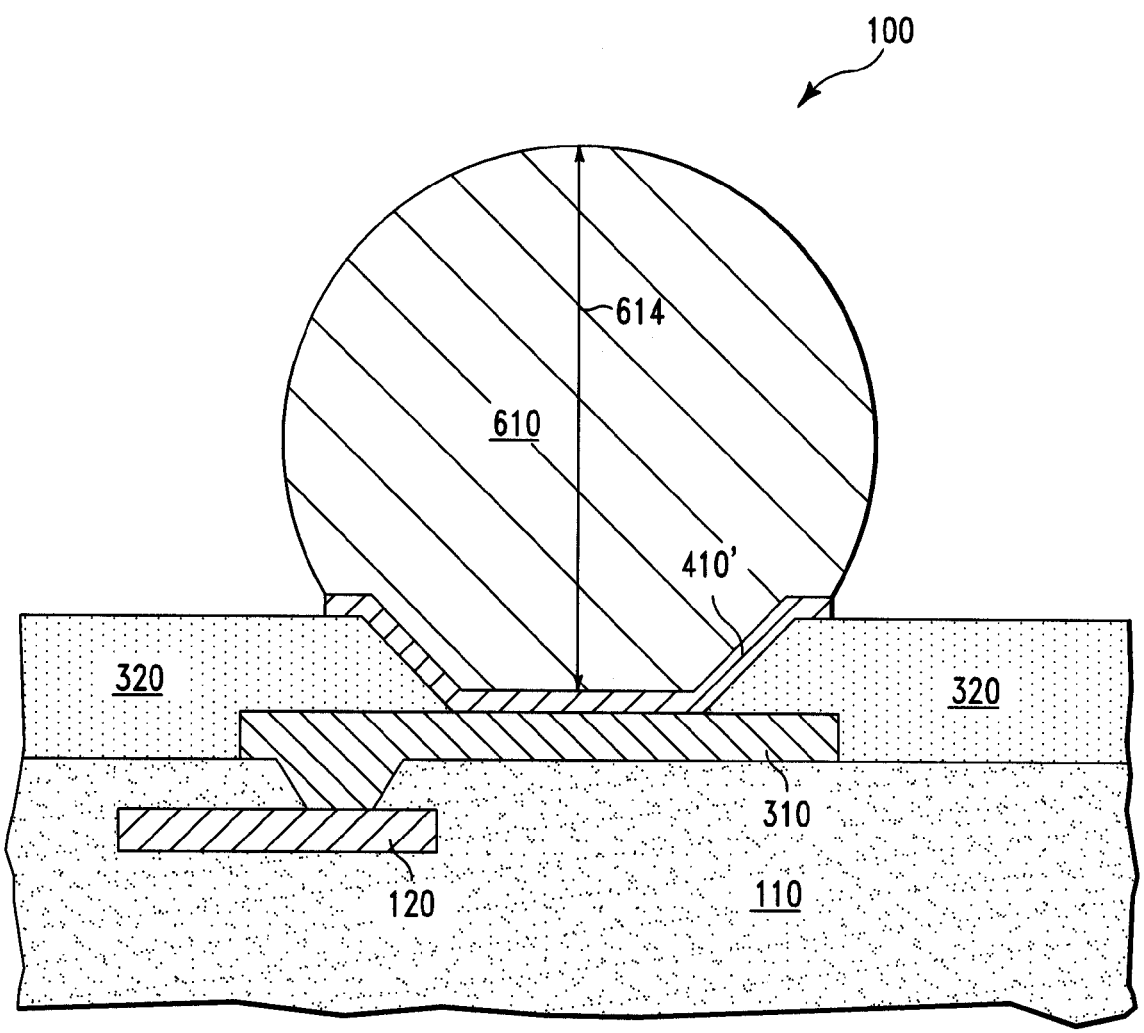

Next, with reference to FIG. 7, in one embodiment, the solder bump 610 is reflowed so as to have a spherical shape at its top portion. Illustratively, the solder bump 610 of FIG. 6 is reflowed by subjecting it to a temperature lower than 400° C. In one embodiment, the resulting solder bump 610 has a height 614 in a range of 100-125 μm.

Figure 8:
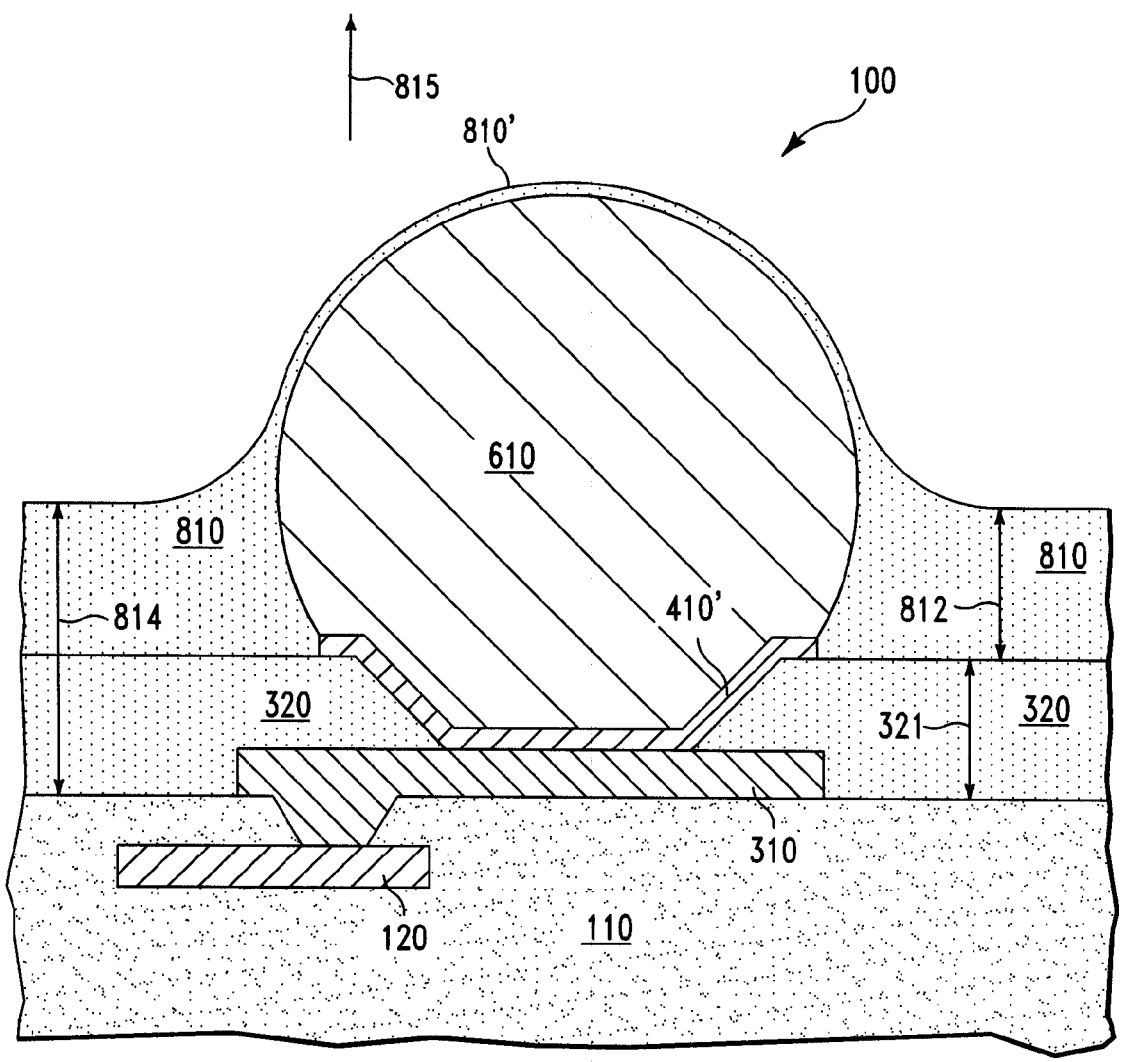

Next, with reference to FIG. 8, in one embodiment, a passivation layer 810 (comprising polyimide and having a thickness 812 of about 20 μm or more in one embodiment) is formed on top of the entire structure 100 of FIG. 7. Illustratively, the polyimide passivation layer 810 is formed by (i) spin-applying liquid polyimide on top of the structure 100 of FIG. 7 so as to form a liquid polyimide layer (not shown) on top of the structure 100 of FIG. 7 and then (ii) curing the liquid polyimide layer at a temperature in a range of 350-370° C. for 1-2 hours so as to form the polyimide passivation layer 810. Because the polyimide passivation layers 810 and 320 are in direct physical contact with each other, they can be collectively referred to as the polyimide passivation layer 810,320.

Next, in one embodiment, a thin polyimide film 810' (a part of the polyimide passivation layer 810) that covers the solder bump 610 is removed so as to expose the solder bump 610 to the surrounding ambient by, illustratively, an ashing process (i.e., using a strongly oxidizing ambient such as oxygen plasma to bombard the thin polyimide film 810'). Alternatively, the thin polyimide film 810' is removed by a mechanical process such as brushing (i.e., using rotating brushes).

As can be seen in FIG. 8, the polyimide passivation layer 810,320 has a thickness 814 which is the sum of the thickness 812 of the polyimide passivation layer 810 and the thickness 321 of the polyimide passivation layer 320. In one embodiment, the polyimide passivation layers 810 and 320 are formed such that the thickness 814 is at least 24 μm.

In the embodiments described above, polyimide is used to form the passivation layer 810. Alternatively, any other material can be used to form the passivation layer 810 provided that the other material has the characteristic of preventing some or all the alpha particles from passing through it. For example, the following materials can be used to form the passivation layer 810: any spin-on dielectric materials, polymers including BCB (benzocyclobutene) and SiLK (an aromatic hydrocarbon polymer), and inorganics including spin-on glasses such as $SiO_2$ or C-doped $SiO_2$.

Figure 9:
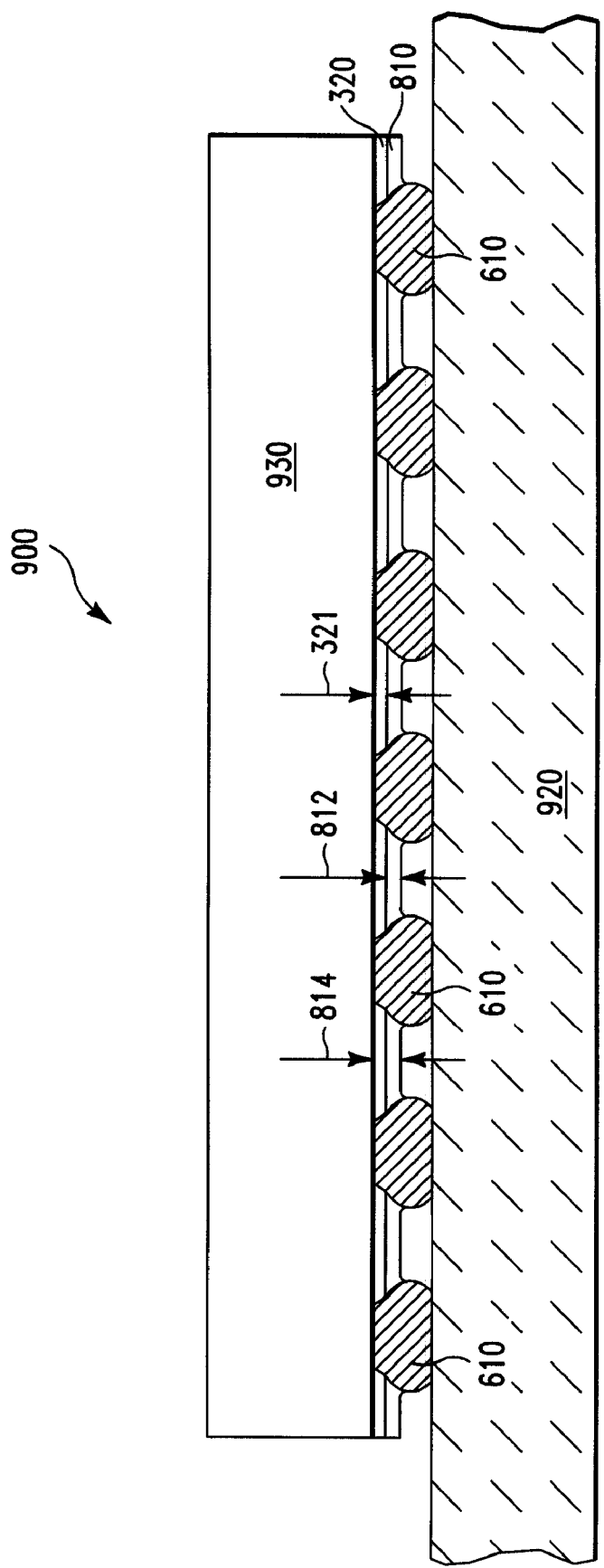
FIG. 9 illustrates one way to use the solder bump structure of FIG. 8 to bond a semiconductor chip to a ceramic substrate so as to form a module, in accordance with embodiments of the present invention.

FIG. 9 illustrates one way to use the solder bump structure 100 of FIG. 8 to bond a semiconductor chip 930 to a ceramic substrate 920 so as to form a module 900, in accordance with embodiments of the present invention.

More specifically, in one embodiment, while the chip 930 is still on a wafer with other chips (not shown), Al bond pads (not shown, but similar to the Al bond pad 310 of FIG. 8) are simultaneously formed on all the chips (including the chip 930) on the wafer.

Next, in one embodiment, the patterned passivation layer 320 is formed on the entire wafer. The patterned passivation layer 320 comprises openings (not shown, but similar to the opening 325 of FIG. 3) directly above the Al bond pads.

Next, in one embodiment, the BLM film 410 (FIG. 4) is formed on the entire wafer. Next, in one embodiment, the patterned photoresist layer 510 (FIG. 5) is formed on the entire wafer. The patterned photoresist layer 510 comprises openings (not shown, but similar to the opening 505 of FIG. 5) directly above the Al bond pads. As a result, the openings in the patterned photoresist layer 510 and the openings in the patterned passivation layer 320 are aligned.

Next, in one embodiment, multiple solder bumps 610 (similar to the solder bump 610 of FIG. 8) are simultaneously formed on all the Al bond pads of all the chips of the wafer (including the chip 930).

Next, in one embodiment, the polyimide passivation layer 810 is formed on top of the entire wafer (including the chip 930). The polyimide passivation layer 810 merges with the patterned passivation layer 320 to form the polyimide passivation layer 810,320. The polyimide passivation layer 810 forms thin polyimide films (not shown, but similar to the thin polyimide film 810' of FIG. 8) on top of the multiple solder bumps 610.

Next, in one embodiment, an ashing process is performed to remove the thin polyimide films on top of the multiple solder bumps 610. Next, in one embodiment, a dicing process is performed to separate the chips (including the chip 930) from the wafer.

Next, in one embodiment, the chip 930 is flipped face down and then aligned to the ceramic substrate 920 as shown in FIG. 9 so that the solder bumps 610 of the chip 930 are bonded directly, simultaneously, and one-to-one to the pads (not shown) of the ceramic substrate 920.

With the presence of the thick polyimide passivation layer 810 (with the thickness 812 being at least 20 µm in one embodiment), a larger number of alpha particles (large subatomic fragments consisting of 2 protons and 2 neutrons) that continuously emit from the ceramic substrate 920 are prevented from entering the chip 930 of the module 900 resulting in a lower number of soft errors in the module 900 during the normal operation of the module 900 (compared with the case where the additional polyimide passivation layer 810 is omitted).

In one embodiment, other chips (not shown) beside the chip 930 are also formed on the same ceramic substrate 920. As a result, the module 900 is called a multi-chip module (MCM). Because no underfill layer is formed between the chips and the ceramic substrate 920, if one of the chips is later found defective during testing, the defective chip can be easily removed from the ceramic substrate 920 and replaced by another chip.

Figure 10:
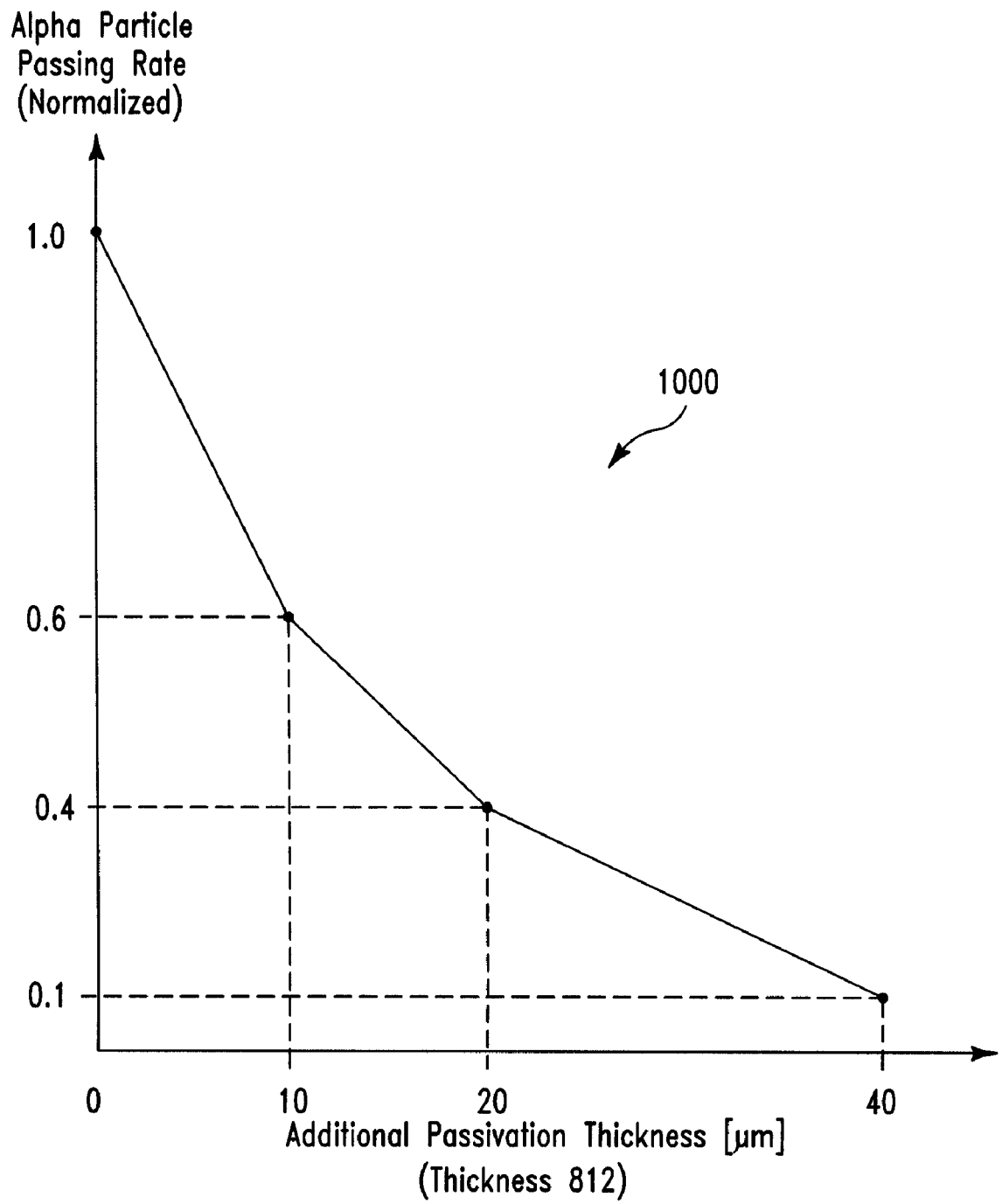
FIG. 10 shows a plot illustrating the benefit of adding an additional passivation layer on top of the solder bump structure of FIG. 8, in accordance with embodiments of the present invention.

FIG. 10 shows a plot 1000 illustrating a relationship between the additional passivation thickness 812 (FIG. 9) and the normalized alpha particle passing rate, in accordance with embodiments of the present invention. The normalized alpha particle passing rate is defined as the ratio of the number of alpha particles passing through both the passivation layers 810 and 320 (FIG. 9) to the number of alpha particles passing through only the passivation layers 320 (FIG. 9).

For example, as can be deducted from the plot 1000, when the thickness 812 (FIG. 9) is 10 µm, the normalized alpha particle passing rate is 0.6, meaning the number of alpha particles passing through both the passivation layers 810 and 320 is 60% of the number of alpha particles passing through only the passivation layers 320. In one embodiment, the relationship between the additional passivation thickness 812 (FIG. 9) and the normalized alpha particle passing rate is determined from empirical data obtained through testing.

In one embodiment, with reference to FIGS. 9 and 10, the thickness 812 of the polyimide passivation layer 810 is at least a minimum thickness such that the normalized alpha particle passing rate is lower than a pre-specified normalized alpha particle passing rate. The minimum thickness can be determined based on the pre-specified normalized alpha particle passing rate and the plot 1000.

For example, assume that the normalized alpha particle passing rate is pre-specified at a target value of 40% (i.e., 0.4). Then, it can be determined from the plot 1000 that the minimum thickness is 20 µm. In other words, in order to have the number of alpha particles passing through both the passivation layers 810 and 320 (i.e., the passivation layer 810,320) not exceeding 40% of the number of alpha particles passing through only the passivation layers 320, the passivation layer 810 must be formed with the thickness 812 being at least 20 µm.

In one embodiment, the normalized alpha particle passing rate is pre-specified at any target value in the range of 0 to 1.0 (e.g., 0.1, 0.2, 0.3, 0.4, 0.5, 0.6, 0.7, 0.8, 0.9, etc.).

In summary, the polyimide passivation layer 810 is formed on top of the patterned passivation layer 320 resulting in the thicker polyimide passivation layer 810,320. As a result, when the chip 930 is later attached to the ceramic substrate 920, the number of alpha particles that enter the chip 930 from the ceramic substrate 920 is reduced compared with the case the polyimide passivation layer 810 is not formed. Therefore, soft error rate during the normal operation of the chip 930 is also reduced.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure formation method, comprising:
   providing a structure which includes:
   (a) a dielectric layer including a dielectric layer top surface that defines a reference direction essentially perpendicular to the dielectric layer top surface,
   (b) an electrically conductive bond pad on and in direct physical contact with the dielectric layer top surface,
   (c) a first passivation layer on the dielectric layer top surface and on the electrically conductive bond pad, wherein the first passivation layer comprises a first hole directly above the electrically conductive bond pad, and
   (d) an electrically conductive solder bump filling the first hole and electrically coupled to the electrically conductive bond pad; and
   after said providing the structure is performed, forming a second passivation layer on the first passivation layer, wherein the second passivation layer is in direct physical contact with the electrically conductive solder bump,
   wherein the electrically conductive solder bump is exposed to a surrounding ambient immediately after said forming the second passivation layer is performed, and wherein said forming the second passivation layer comprises:
  determining a relationship between a thickness of the second passivation layer and a normalized alpha particle passing rate, wherein the normalized alpha particle passing rate is a ratio of a first number of alpha particles passing through both the first and second passivation layers to a second number of alpha particles passing through only the first passivation layer;
  specifying a target normalized alpha particle passing rate;
  determining a minimum thickness based on the target normalized alpha particle passing rate and the relationship; and
  forming the second passivation layer having the thickness in the reference direction being at least the minimum thickness.

2. The method of claim 1, wherein target normalized alpha the particle passing rate is lower than 0.6.

3. The method of claim 1,
wherein the first and second numbers of alpha particles come from a substrate of the provided structure, and
wherein the dielectric layer is on and in direct physical contact with the substrate.

4. A structure formation method, comprising:
providing a structure which includes:
  (a) a dielectric layer including a dielectric layer top surface that defines a reference direction essentially perpendicular to the dielectric layer top surface,
  (b) N electrically conductive bond pads on and in direct physical contact with the dielectric layer top surface, N being an integer greater than one,
  (c) a first passivation layer on the dielectric layer top surface and on the N electrically conductive bond pads,
    wherein the first passivation layer comprises N holes which are one-to-one directly above the N electrically conductive bond pads,
  (d) N electrically conductive solder bumps filling one-to-one the N holes and electrically coupled one-to-one to the N electrically conductive bond pads; and
after said providing the structure is performed, forming a second passivation layer on the first passivation layer,
  wherein the second passivation layer is in direct physical contact with the electrically conductive solder bump,
  wherein the electrically conductive solder bump is exposed to a surrounding ambient immediately after said forming the second passivation layer is performed, and
  wherein said forming the second passivation layer comprises:
    determining a relationship between a thickness of the second passivation layer and a normalized alpha particle passing rate, wherein the normalized alpha particle passing rate is a ratio of a first number of alpha particles passing through both the first and second passivation layers to a second number of alpha particles passing through only the first passivation layer;
    specifying a target normalized alpha particle passing rate;
    determining a minimum thickness based on the target normalized alpha particle passing rate and the relationship; and
    forming the second passivation layer having the thickness in the reference direction being at least the minimum thickness.

5. The method of claim 4,
wherein the first and second numbers of alpha particles come from a substrate of the provided structure, and
wherein the dielectric layer is on and in direct physical contact with the substrate.

* * * * *